United States Patent [19]

Chesavage

[11] Patent Number: 5,036,280
[45] Date of Patent: Jul. 30, 1991

[54] PHANTOM FOR MAGNETIC RESONANCE IMAGING SYSTEM

[75] Inventor: Jay A. Chesavage, Palo Alto, Calif.
[73] Assignee: MRI Technologies, Mountain View, Calif.
[21] Appl. No.: 479,389
[22] Filed: Feb. 13, 1990
[51] Int. Cl.$^5$ .............................................. G01V 3/00
[52] U.S. Cl. .................................................. 324/308
[58] Field of Search ............... 324/300, 307, 308, 318, 324/322

[56] References Cited

U.S. PATENT DOCUMENTS

| | | | |
|---|---|---|---|
| 4,613,819 | 9/1986 | Chui | 324/308 |
| 4,618,826 | 10/1986 | Smith et al. | 324/308 |
| 4,625,168 | 11/1986 | Meyer et al. | 324/318 |
| 4,888,555 | 12/1989 | Vaughan et al. | 324/318 |

*Primary Examiner*—Hezron E. Williams
*Assistant Examiner*—Louis M. Arana
*Attorney, Agent, or Firm*—Flehr, Hohbach, Test, Albritton & Herbert

[57] ABSTRACT

A cylindrical tube with closed ends contains an imaging fluid and a variety of imaging structures enclosed. Included is a slice thickness structure with a hole pattern in a chevron shape where the number of imaged holes determines the slice thickness. Slice planarity is determined by a number of contiguous disks with grooved patterns set at rotated angles with respect to each other. Geometric distortion and resolution are also measured by structures contained within the enclosure. Finally, the position of the first and last slices in a multiscan series is measured for accuracy by ramp wedges placed on the end caps of the enclosure. And lastly, air is entrapped in closed cell foam so there are no unconstrained bubbles migrating in the enclosure.

15 Claims, 10 Drawing Sheets

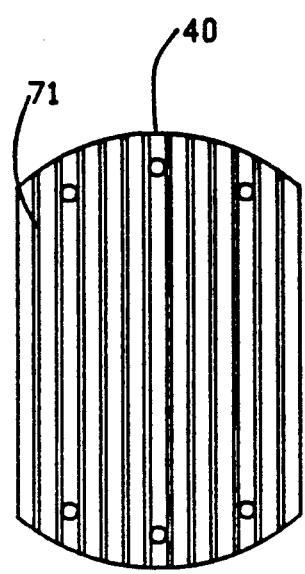 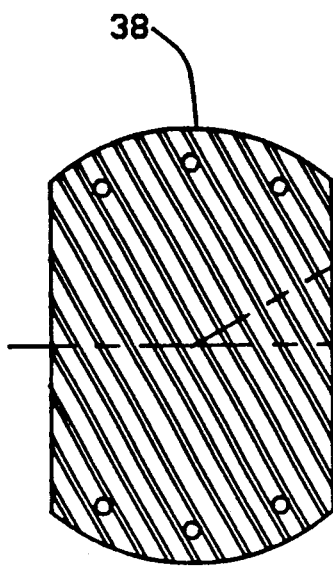 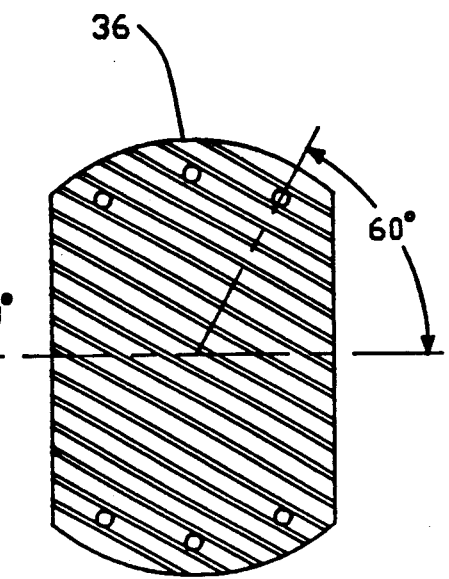
FIG.-5A     FIG.-5B     FIG.-5C
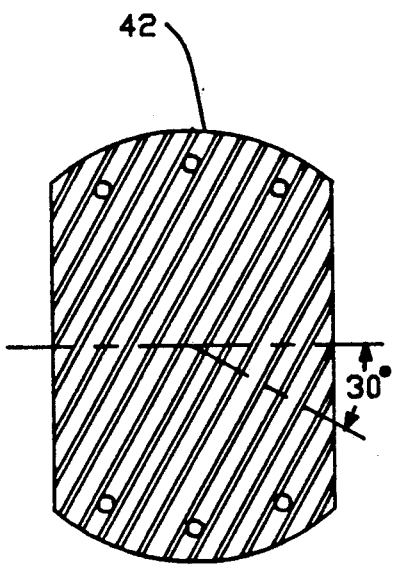 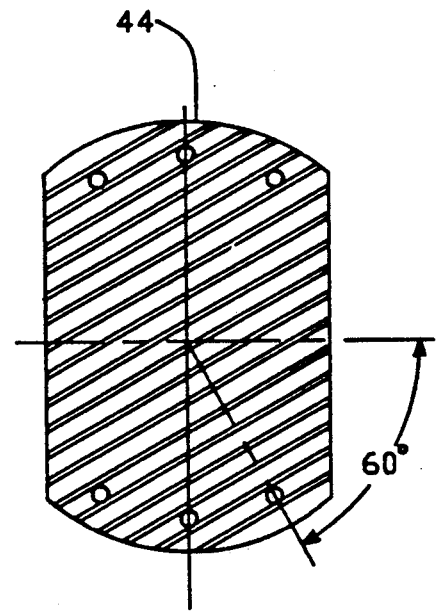
FIG.-5D     FIG.-5E

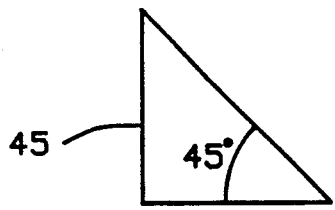
FIG.-9A
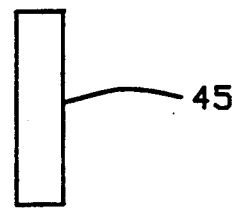
FIG.-9B
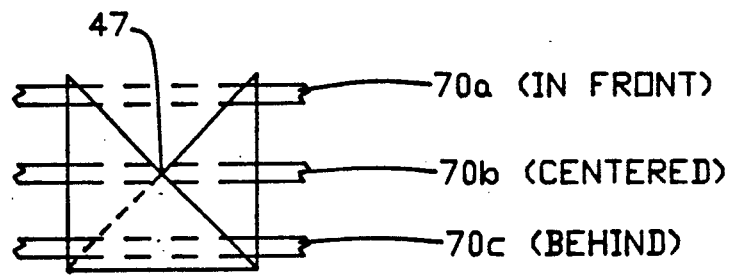
FIG.-9C
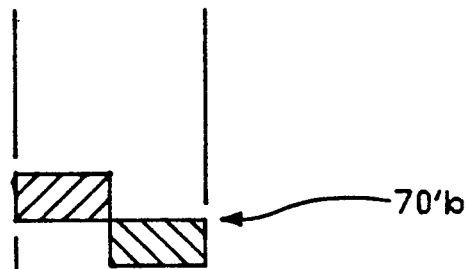
FIG.-9D
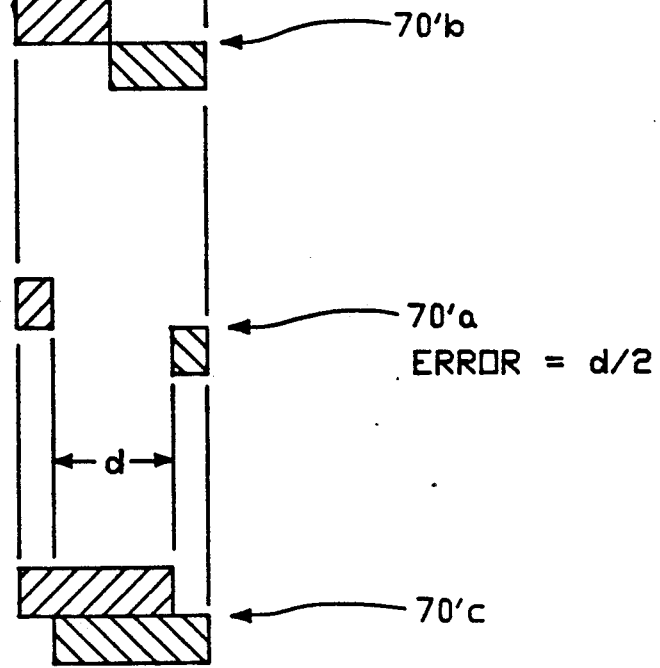
FIG.-9E
FIG.-9F

PHANTOM FOR MAGNETIC RESONANCE IMAGING SYSTEM

FIELD OF THE INVENTION

This invention relates to a device for measuring the performance of a magnetic resonance imaging (MRI) system. Specifically, the invention allows the measurement of slice thickness, slice contiguity, slice position, slice planarity, signal to noise ratio (SNR), geometric distortion, horizontal and vertical resolution, and end slice positional accuracy in an MRI scanner.

DESCRIPTION OF PRIOR ART

Prior art systems have been disclosed in various forms, generally involving applications in magnetic resonance imaging, X-ray and ultrasound. These imaging systems rely on either passive or active return of signal energy back to a transducer for image formation. In the interest of assuring the accuracy of the resulting images, a class of measurement devices have been used, which are referred to generally as imaging phantoms. The purpose of these imaging phantoms is to provide structures of known geometries and content to enable a comparison between the expected and actual image. One such prior art system is described in U.S. Pat. No. 4,692,704. This device, as shown in FIG. 1, consists of a sandwich of 2 mm thick disks, with each disk having a 12° sector removed. When assembled, each disk is rotated by 12° with respect to its neighbors, forming a helix of sector gaps from the front to the back of the phantom. The resulting images from such a phantom produce signal from each gap contribution in each disk such that the number of gaps visible in the image is proportional to the slice thickness. The chief disadvantages of this approach are that the assembly consists of many disks to construct a phantom of even modest extent, and the resulting phantom is unable to provide an indication of the slice planarity, or slice warpage. In addition, the collection of components used to measure slice thickness is difficult to combine with other structures for use in measurements unrelated to slice thickness, such as geometric distortion, resolution, etc. Consequently, this phantom is single purpose, and measures slice information only.

U.S. Pat. No. 4,419,577 describes a phantom for testing scintillation cameras for planar resolution. It consists of a series of precisely machined grooves filled with mercury, which is opaque to X-rays. This phantom enables the measurement of resolution of the X-ray sensor for structures located near each other.

A system for calibrating the signal level relative to adjacent levels is described in U.S. Pat. No. 4,400,827. This invention describes a disk which rotates synchronously to the imaged region so as to produce a fixed pattern on film, which can then be used to measure the density and exposure settings of the film. U.S. Pat. No. 4,460,832 describes another such system for use in a projection X-ray system. It is comprised of a sandwich of hole patterns in an attenuating material whose effective depth varies from one material thickness to the thickness of the entire phantom. This enables the measurement of scintillator attenuation transfer function. Another phantom for use in a subtractive X-ray system is described in U.S. Pat. No. 4,472,829, which describes a method for manufacturing an imaging phantom with a contrast region for measurement of imaging system performance.

OBJECT AND SUMMARY OF INVENTION

It is an object of the present invention to provide a phantom for MRI multi-purpose measurement.

In accordance with the above object, there is provided a phantom for measuring the performance of a magnetic resonance imaging (MRI) system having a predetermined slice thickness where the slice is in a YZ plane and the thickness is along an X-axis, the XYZ axes being a three dimensional orthogonal system. The phantom comprises an elongated hollow enclosure with an elongate axis parallel to the X-axis for insertion in an MRI system and for retaining a fluid to which the MRI system is relatively more sensitive than the enclosure material. Positioned in the enclosure are means for measuring said slice thickness, including a plate-like structure substantially parallel to said X-axis, fastened within said enclosure, and having a plurality of elongate channels, each channel having a common and predetermined width smaller than the slice thickness in which the fluid may circulate, the elongate axis of each channel being parallel to the plane of the slice. The axes of the plurality of channels also lie in a substantially diagonal plane extending from the front of the slice to its rear, whereby the number of channels appearing in an MRI slice image is indicative of slice thickness.

BRIEF DESCRIPTION OF THE DRAWINGS

FIGS. 5A–5E are plan views of slice planarity disks.

FIG. 9A is an elevation view of a ramp wedge.

FIG. 9B is an end view of FIG. 9A.

FIG. 9C is an elevation view of two assembled ramp wedges.

FIGS. 9D–9F are image diagrams showing various slice positions.

DESCRIPTION OF THE PREFERRED EMBODIMENT

Figure 1:
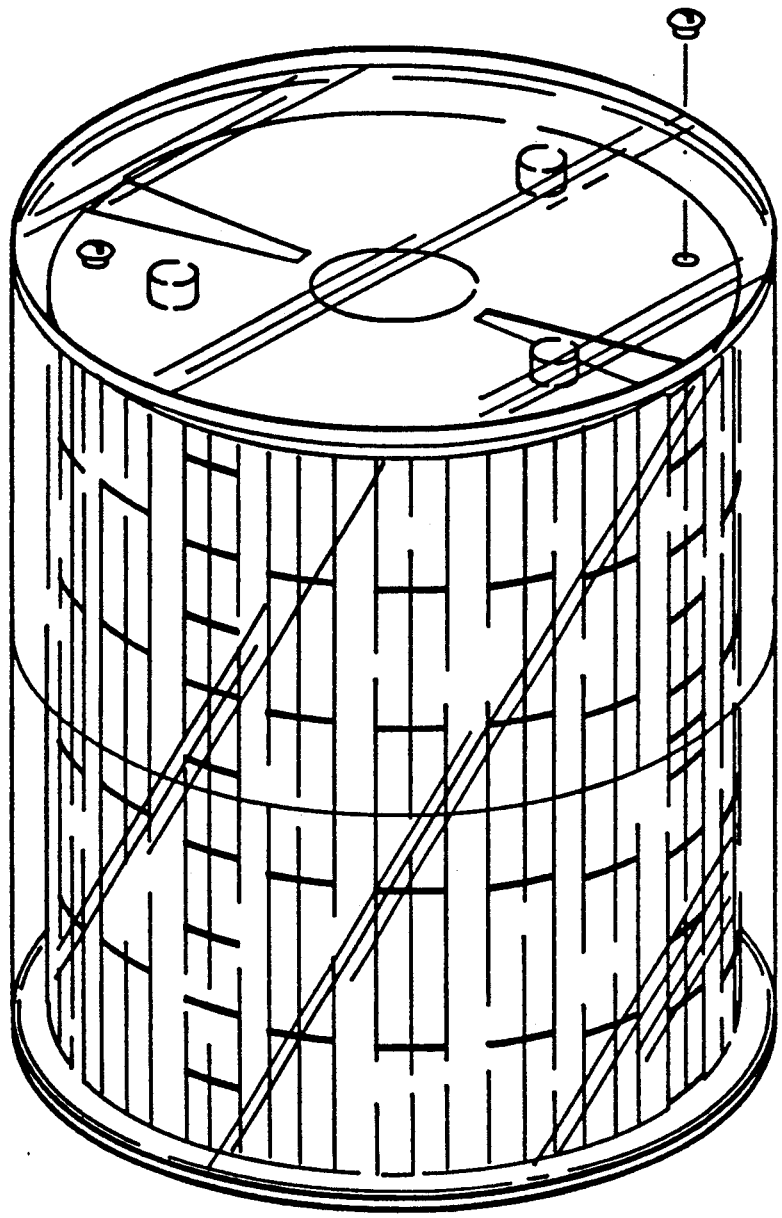
FIG. 1 is a perspective view of a prior art phantom.
Figure 2A:
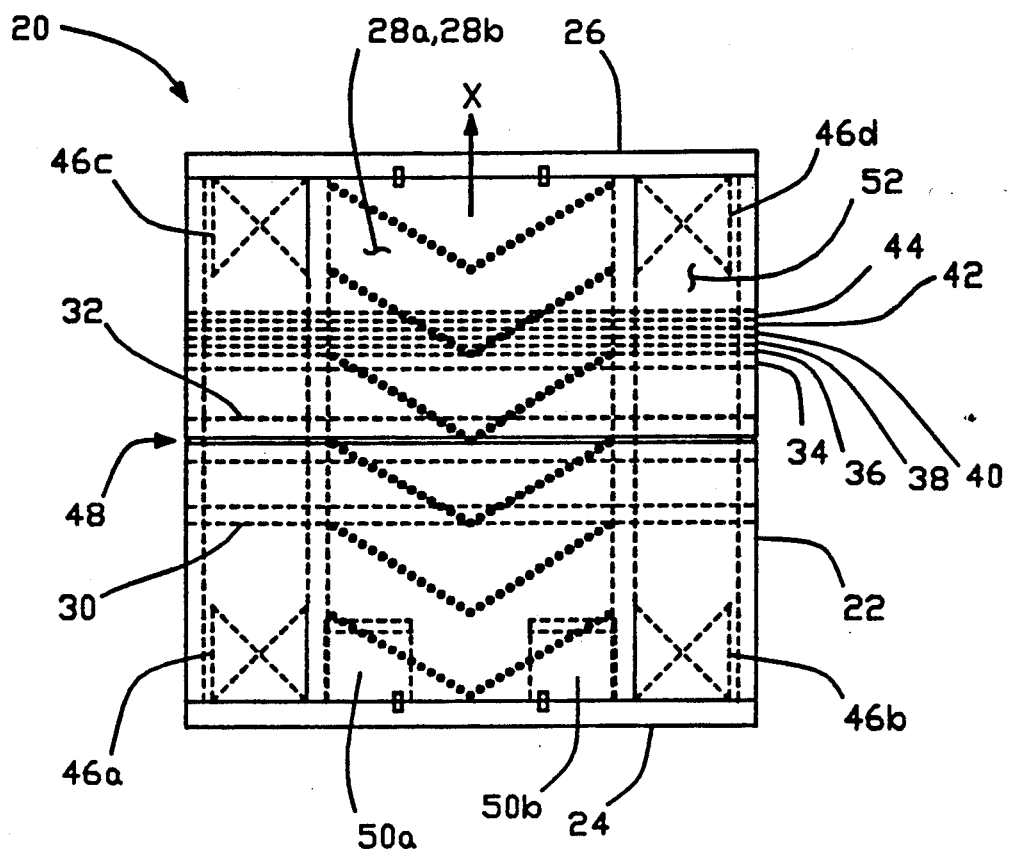
FIG. 2A is an elevation view of the present invention.

FIG. 2A illustrates a phantom 20 embodying the present invention which includes a hollow cylindrical outer enclosure 22 constructed of a plastic material which is transparent to MRI signals and is a generally tubular or of a cylindrical elongated shape along an X axis. Front and rear end caps 24 and 26 complete the enclosure. This phantom is, as discussed above, inserted in an MRI system and retains fluid to which the MRI system is relatively more sensitive than the plastic enclosure material. Typically, the MRI system senses the hydrogen content of the fluid which is water.

Figure 2B:
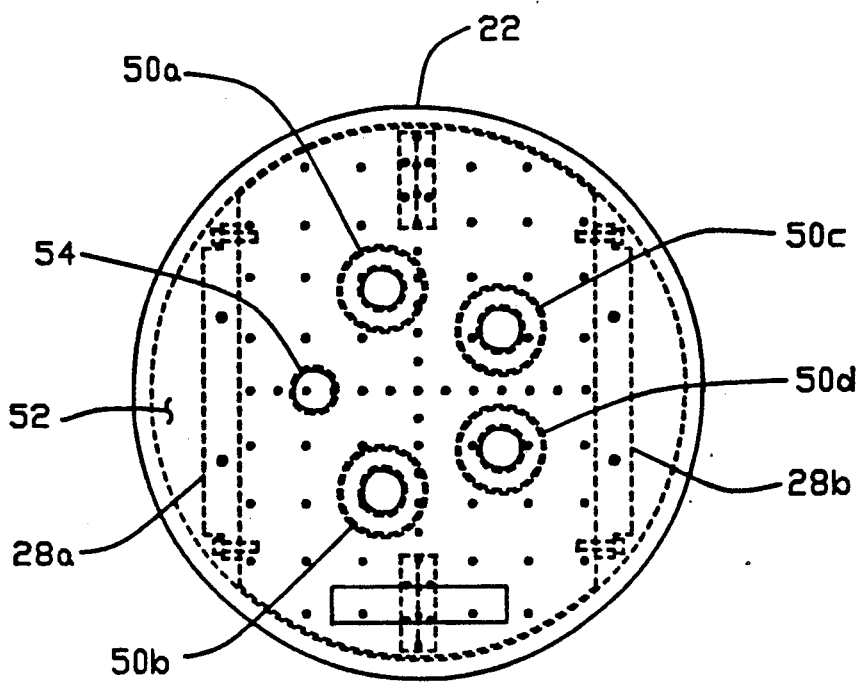
FIG. 2B is a bottom view of the present invention.

Referring now also to FIG. 2B, oriented along the X axis is a pair of plate-like structures 28a and 28b, also constructed of a similar plastic material as enclosure 22, which is supported by the end caps 24 and 26 and extend the entire length of tubular enclosure 22.

Fitted in the front end cap 24 are four liquid fill chambers 50a, 50b, 50c and 50d. These are for the containment of optional fluids with various properties for imaging alongside each other and with the main fluid 52, which is contained in the overall phantom 20. The main fluid 52 is filled through a fill port 54. All the fill ports are sealed with a threaded plug and rubber seal.

As will be discussed below, the plate-like structures 28a and 28b, in addition to serving as a means of measuring slice thickness, also provide a mounting for various disks which measure other parameters of performance. Specifically, the disks 34, 36, 38, 40, 42 and 44 are used for slice planarity; disk 30 for image resolution; and disk 32 for geometric distortion. Disk 34 actually acts as a support for the remainder of the planarity disks 34, etc.

To measure errors in slice position of a multi-slice scan series, ramp wedge pairs 46a, 46b, 46c and 46d respectively are located on the end caps 24 and 26. Lastly, a groove 48 indicates the center of the phantom.

Figure 3:
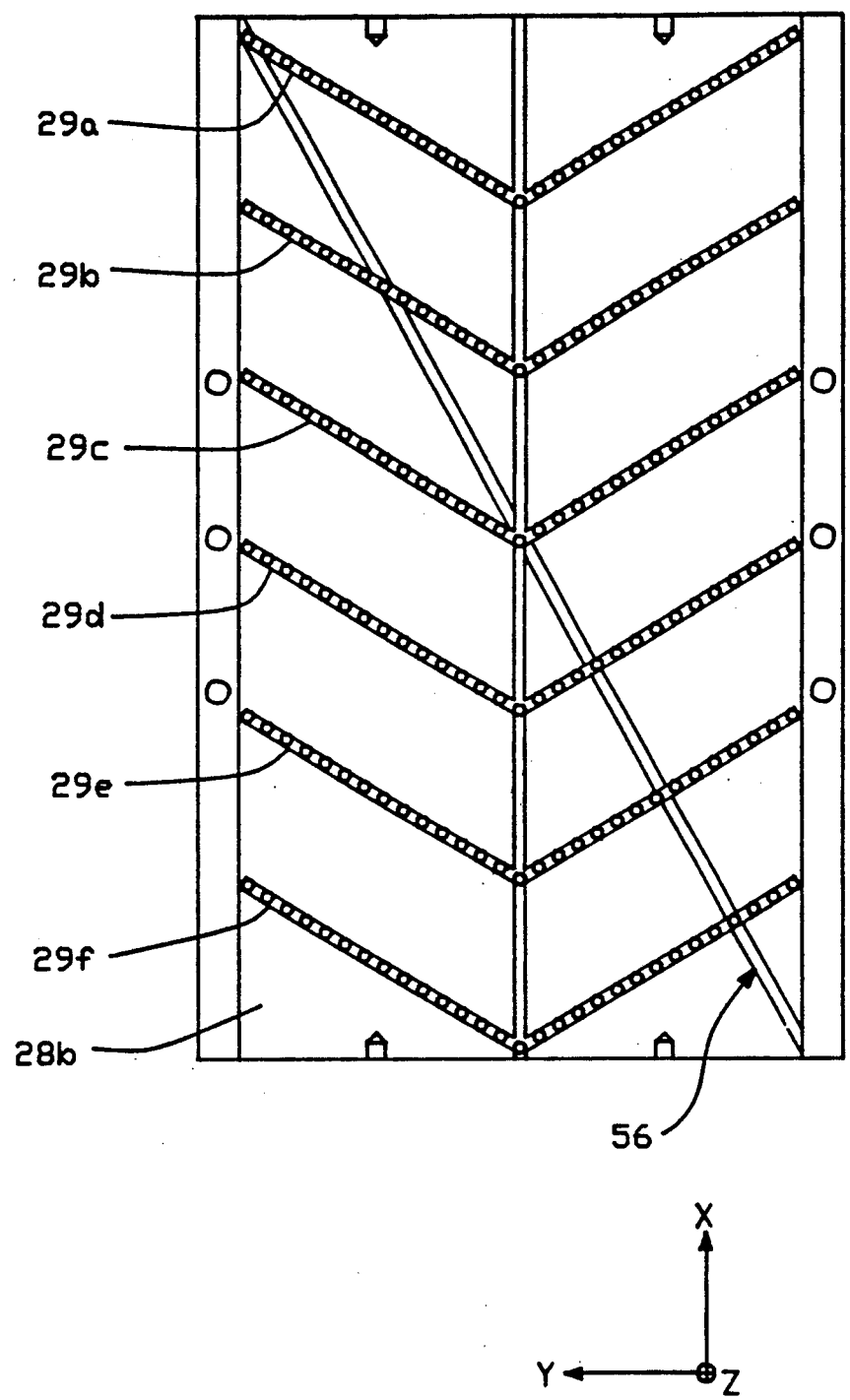
FIG. 3 is an elevation view of the slice thickness structure.
Figure 4A:
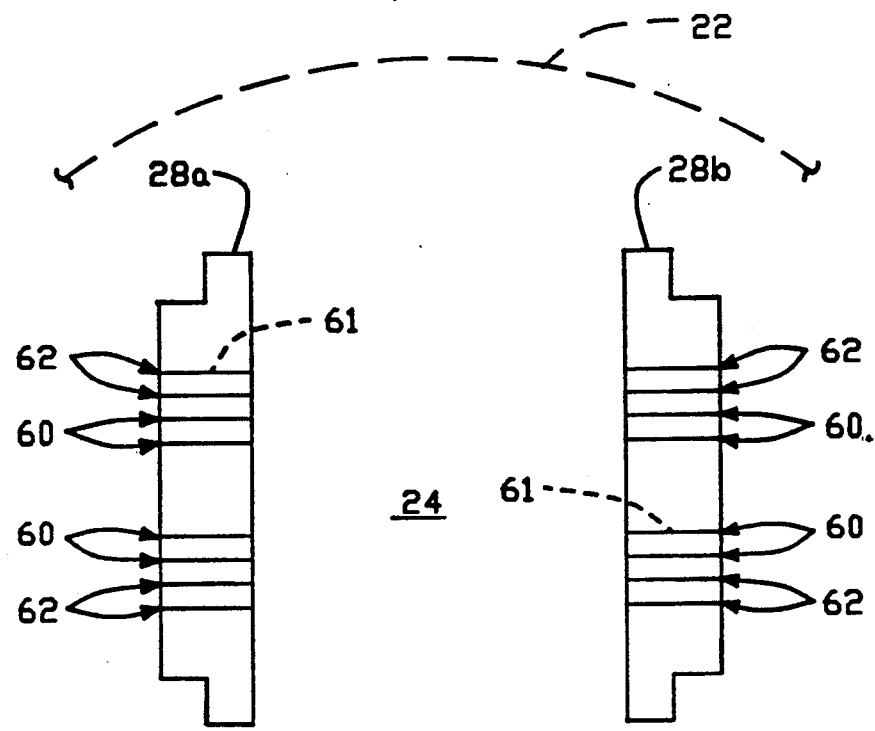
FIG. 4A is an elevation view of the slice thickness structure, as seen by the magnetic resonance system.

FIG. 3 illustrates in greater detail the slice thickness plate 28b. In addition, FIG. 4B shows an enlarged detail of one of the "chevrons" or "Vs" of the slice thickness plate and FIG. 4A illustrates a typical image which is produced and illustrates how slice thickness is actually measured.

Referring to all three of these figures, and as more particularly shown in FIG. 3, there is a separate chevron-type structure or 'V' formation for each slice to be measured of a multi-slice MRI scan series. But (as will be discussed below) not all of the slices of such scan series are measured for thickness. As illustrated in FIG. 3, there are chevron-type structures 29a to 29f along the X axis; one for each slice to be measured In addition, each plate 28a and 28b includes a diagonal groove 56 extending substantially from one end of enclosure 22 to the other for indicating the slice position in a scan series.

Figure 4B:
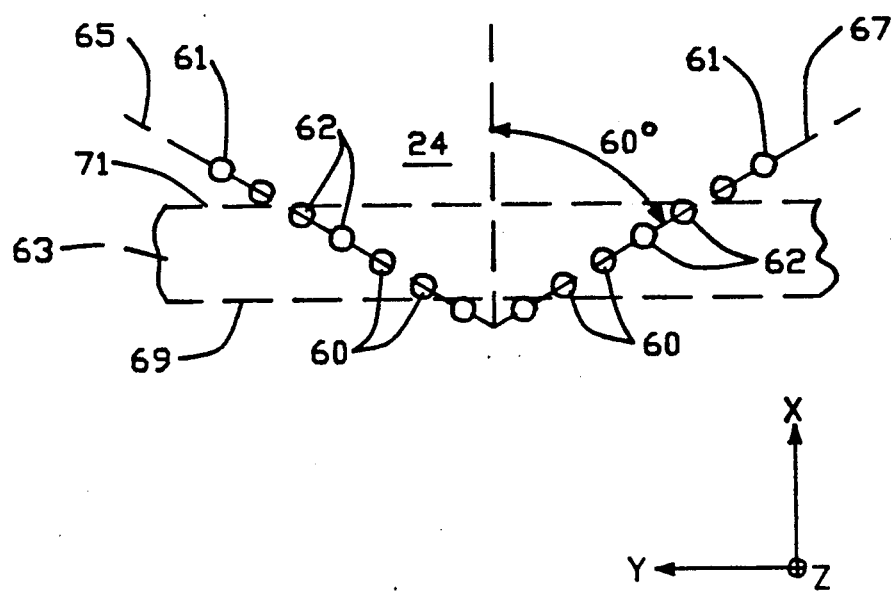
FIG. 4B is an enlarged view of a portion of FIG. 3 showing how the image of FIG. 4A is produced.

FIG. 4B illustrates a detailed view of one of the chevrons; for example, 29a. Included in the plate-like structures 28a and 28b are holes 61 for each chevron which are elongate in nature, as shown by the cross-section in FIG. 4A (FIG. 4A is an image; thus, the holes 61 are actually shown by the fluid contained within the hole). Each hole has a common and predetermined width (diameter) which is smaller than the slice thickness within which fluid may circulate. The elongate axis of each hole is parallel to the plane of the slice, which as illustrated in FIG. 4B, is in the YZ plane. And the dashed outline indicated at 63 is the slice which is currently being measured.

The axes of the channels or holes 61 also lie in a diagonal plane, indicated as 65 and 67, which extends at least from the front of the slice 69 to its rear 71.

In general, the holes 61 are spaced from one another so that when the holes or channels are projected in a YZ plane, they are spaced from one another and in an XZ plane they are contiguous to one another. This allows the MRI image to distinguish the holes as discrete bars, as illustrated in FIG. 4A. The two bars 60 are produced by the holes at the front 69 of the slice (see also FIG. 4B) and the two bars 62 are produced by the holes at the rear 71 of the slice. Since the holes are 2 mm in diameter, four bars can be counted and thus there is a slice thickness of 8 mm. The two axes of symmetry of the slice thickness structures 28a, 28b allow for the measurement of slice thickness in four different places in the image, enabling the determination of asymmetry in slice thickness.

Specific dimensions of the holes and their spacing as alluded to above are holes of 2 mm diameter and 2 mm center to center in the direction of X (thus providing for a contiguous projection) and approximately 4 mm in the direction Y (thus providing for spacing between the holes). As illustrated, the diagonal planes 65 and 67 are at a 60° angle with the X axis. From a practical standpoint other dimensions and angles could be used but in order to distinguish the hole images properly, a 45° angle is the minimum.

As illustrated in FIG. 2A, there are five contiguous disks 36, 38, 40, 42 and 44 (along with supporting disk 34) for measuring slice planarity. In other words, any warping or cupping of the slice will be indicated. Details of the various disks are shown in FIGS. 5A through 5E where each of the five respective disks has a thickness substantially equal to the predetermined slice thickness.

Each disk, as illustrated in FIGS. 5A-5E, has a uniform groove pattern with parallel grooves 71 all the way across one surface. The fluid of course may circulate in these grooves. As is illustrated, the grooves of adjacent disks are rotated from one another at 30° angles from a minus 60° for disk 36 to a positive 60° for disk 44. Then disk 40 is nominally at 0° with disks 42 and 38 at a plus and minus 30° respectively. In other words, the groove pattern is rotated from a −60 to a +60 clockwise in 30° increments, from front to rear, with reference to item 40.

The purpose of the groove pattern is to provide the ability to distinguish the image of one planar disk compared to the next or adjacent disk. Any other similar pattern of grooves, etc., for achieving this function is sufficient. When assembled as shown in FIG. 2A, the groove pattern can be visualized as rotating clockwise from disk to disk when moving from the front cap to the rear cap. Since the image slice thickness is chosen typically to be the same thickness as one planarity disk, the variations in a slice plane appear as migrations from one disk pattern to another.

Figure 6:
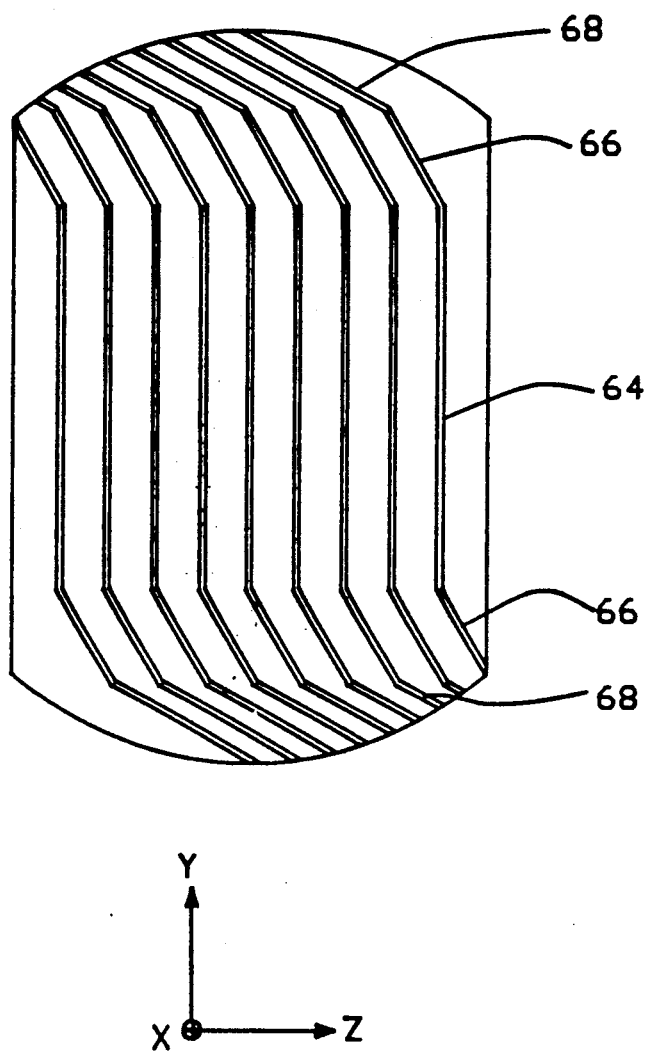
FIG. 6 is an image of three slice planarity disks as viewed by a magnetic resonance imaging system.

FIG. 6 shows such pattern as might be taken from an MRI scanner, with planar distortion as viewed from the front of the phantom. Thus, pattern 64 is contributed by disk 40, pattern 66 above and below pattern 64 is contributed by disk 38, and pattern 68 above and below pattern 64 is contributed by disk 36. By examination, it can therefore be determined that the slice has a concave cupping, symmetrical about the Z axis. The cupping involves two disks, 36 and 38 (in addition to the disk 40). If there were no cupping, only disk 40 would be seen. Since each disk is 3 mm thick, it can be determined that the slice is 6 mm peak to peak out of plane. While disks of specific dimensions are shown, other combinations are of course possible since the present concept will provide the same measurement capability.

Figure 7A:
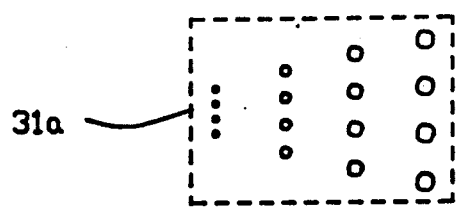
FIG. 7A is an enlarged plan view of a portion of a resolution structure.
Figure 7B:
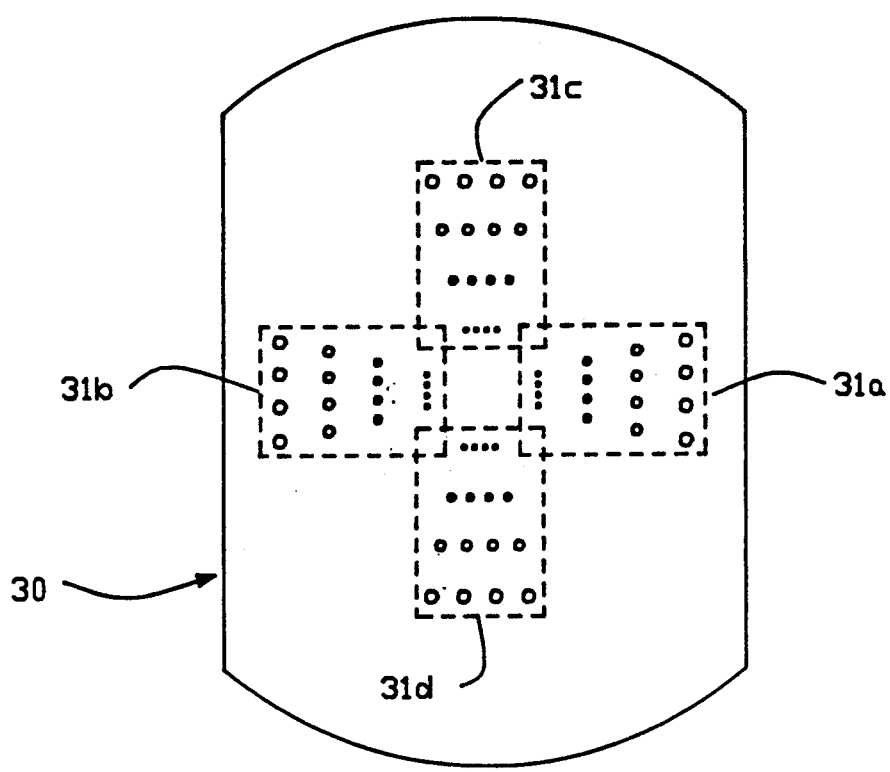
FIG. 7B is a simplified plan view of all of the resolution structure of FIG. 7A.

FIG. 7B shows an overall resolution disk 30, which is mounted as illustrated in FIG. 2A, and FIG. 7A illustrates a detailed section 31a which is one of four 31a–31d. The disk 30 includes a plurality of groups of apertures of successively smaller diameter, as illustrated in the section 31a. Specifically, a typical series of holes may have diameters of 2 mm, 1 mm, 0.75 mm and 0.5 mm. These dimensions are both for hole diameters and edge to edge spacing. Thus, the separation of the holes or apertures is equal to their respective diameters. The resolution of the MRI scanner may be determined by examining the resultant images to establish which one of the hole patterns is resolvable. One criterion used for resolution is the ability to measure a drop of ½ in signal intensity between two adjacent signal sources.

The sections 31a–31d as illustrated in FIG. 7B are placed on the horizontal and vertical axes as pairs, that is, sections 31a and 31b for the horizontal axis and sections 31c and 31d for the vertical axis. The presence of both horizontal and vertical resolution targets allows for measurement of resolution in both phase encoding and readout gradient directions. Other resolution measurement constructions are available for this purpose, such as a series of wedges with their gap and thickness equal across the scan plane, but the hole pattern shown in the present invention is believed to be optimum.

Figure 8:
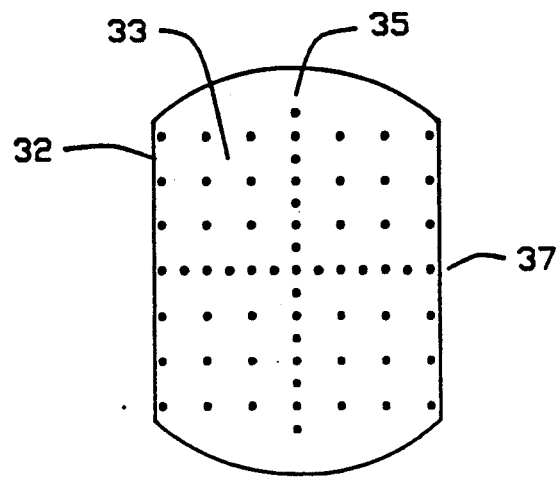
FIG. 8 is a plan view of a geometric distortion structure.

FIG. 8 illustrates the disk 32 (whose location is shown in FIG. 2A) for determining geometric distortion. Here there is a pattern 33 of apertures located in a rectangular array. Very specifically, the optimum array is believed to be holes generally arranged on 20 mm centers but with at least one vertical row 35 and one horizontal row 37 on 10 mm centers.

FIG. 9C shows a typical ramp wedge pair, for example, 46a, which consists of two individual wedges 45, as shown in FIGS. 9A and 9B. When the pair of wedges is placed together, the ramp wedge pair 46a provides an intersection at 47 because of the overlapping construction of the ramp wedges, which is located at the nominal center of a slice 70f. Thus, when slice 70f indicated in its centered position of FIG. 9C is imaged, the image 70f of FIG. 9D results. The patterns of FIGS. 9E and 9F result if the slice is in front of or behind the intersection 47 respectively. This error distance can be measured to show the positional error of at least the first and last slice in the scan series.

Figure 10:
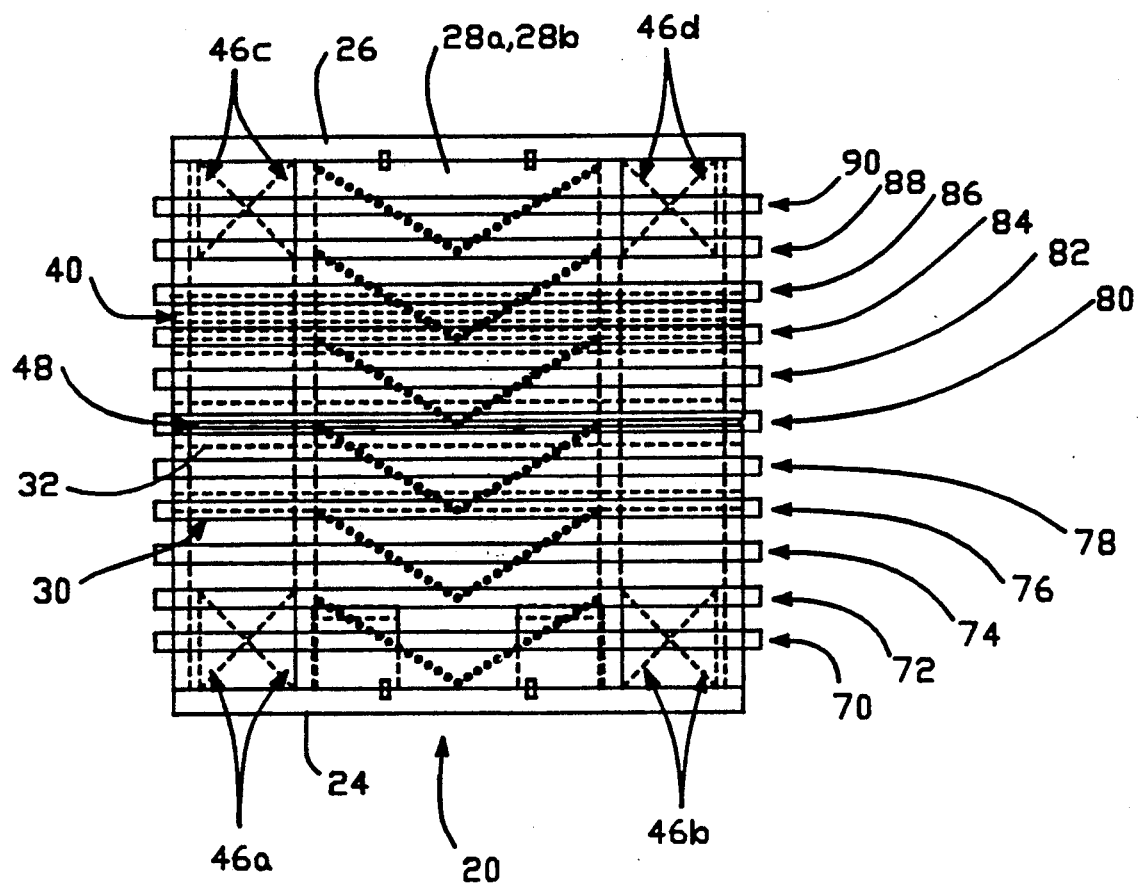
FIG. 10 is an elevation view of the phantom with the slice locations shown.

FIG. 10 shows the location and extent of a scan series of eleven slices in the phantom 20. These slices are typical of those imaged on an MRI scanner. The location of these imaging slices is selected through the commonly available parameters of slice thickness and slice gap. Such slices are designated 70, 72, 74, etc., through 90, using an even number series. For the series shown, the slice thickness and the slice gap are both set to 7.5 mm. Other combinations would work satisfactorily. The slices 70 and 90 are the locations of the first and last slices of the scan series and these slices, as illustrated, are nominally located at the centers of the ramp wedges 46a, 46b, 46c and 46d. This allows the convenient determination of slice location errors. The location of the resolution disk 30 is set to the center of slice 76. Slice 80 occurs at the center of the phantom determined by the groove line 48 (see also FIG. 2A). This is also coincident with the center of the geometric distortion disk 32. The various disks are shown in dashed outline in FIG. 10 (similar to FIG. 2A) with of course the slices being shown in solid outline.

The slice thickness plates 28a and 28b provide for a thickness measurement of slices 70 through 90. The remaining slices 72, 74, 76, 78, 86 and 88 are without interference from the other structures. Thus, they're utilized for providing the return of the full signal for measurement of signal to noise ratio (SNR), radio frequency (RF), uniformity and main field inhomogeneity. The objective of this arrangement is that the imaged structures are positioned in the phantom such that a single multi-slice scan images each structure individually without repeating a series of single slice scans. And each slice of a multi-slice MRI scan will occur at the center of a particular target structure; and then other structures are spaced such that the slices are in zones free of structures.

Figure 11A:
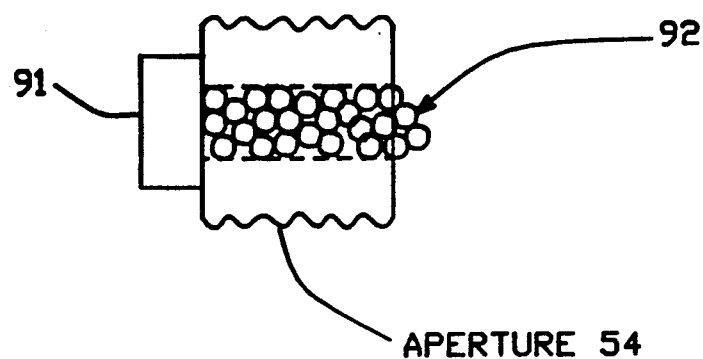
FIG. 11A is an elevation view of an integral fluid expansion structure.

FIG. 11A shows a sealing plug 91 which is threaded and fits into the aperture 54. It includes an expandable bladder 92 typically made of closed cell foam 92. This allows for the expansion and contraction of the fluid 52 within the enclosure 20 without mechanically stressing the enclosure. Prior systems have achieved this function through the inclusion of a small amount of air in the fluid chamber. This air bubble enabled the expansion and contraction of the main fluid. But the air bubble tends to break up into smaller bubbles and becomes entrapped in the structure. The closed cell foam 92 is injected into the interior of the plug 91. This allows the contraction and expansion of the main fluid 52, without allowing the migration of bubbles through the imaging structures. There are many forms for bladders, but it is believed that the closed cell foam material is ideal.

Figure 11B:
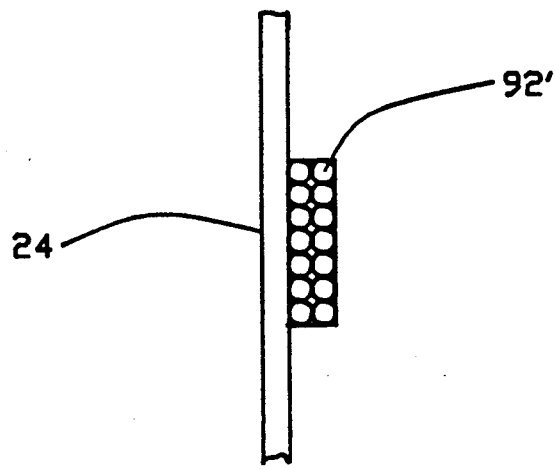
FIG. 11B is an elevation view of an alternative integral fluid expansion structure.

FIG. 11B illustrates the same foam material 92' located on end cap 24. Thus, the foam may be attached to any of the inside structures and still function satisfactorily.

In conclusion, an improved phantom for an MRI system has been provided.

What is Claimed

1. A phantom for measuring the performance of a magnetic resonance imaging (MRI) system having a predetermined slice thickness where the slice is in a YZ plane and the thickness is along an X-axis, said XYZ axes being a three dimensional orthogonal system, said phantom comprising:

an elongated hollow enclosure with an elongate axis parallel to said X-axis for insertion in an MRI system and for retaining a fluid to which said MRI system is relatively more sensitive than said enclosure material;

means positioned in said enclosure for measuring said slice thickness, including a plate-like structure substantially parallel to said X-axis, fastened within said enclosure, and having a plurality of elongate channels, each channel having a common and predetermined width smaller than said slice thickness in which said fluid may circulate, the elongate axis of each channel being parallel to the plane of said slice, and said axis of each of said plurality of channels also lying in a substantially diagonal plane extending from the front of said slice to its rear, whereby the number of channels appearing in an MRI slice image is indicative of slice thickness.

2. A phantom for measuring the performance of a magnetic resonance imaging (MRI) system having predetermined slice thickness which nominally lies in a single YZ plane with the thickness being along an X-axis, the XYZ axes being a three dimensional orthogonal system, said phantom comprising:

an elongated hollow enclosure with an elongate axis parallel to said X-axis for insertion in an MRI system and for retaining a fluid to which said MRI system is relatively more sensitive than said enclosure material;

means positioned within said enclosure for measuring said slice planarity in said YZ plane, including a plurality of disks in said YZ plane and parallel to said slice, each disk having parallel grooves in which said fluid may circulate and each having a common thickness substantially equal to said predetermined slice thickness, said disks being substantially contiguous, said grooves of adjacent disks each being at a different angle with respect to said X-axis, whereby MRI images of said grooves of said disks indicate planarity by combined images of grooves of a plurality of disks caused by a non-planar or warped slice.

3. A phantom as in claim 1 where said plate-like structure includes a second plurality of elongate channels oriented and sized similarly to said plurality of channels but lying in a diagonal plane which forms a 'V' with said substantially diagonal plane whereby asymmetry in slice thickness may be determined.

4. A phantom as in claims 1 or 2 where said MRI system provides a multi-slice scan series where a predetermined plurality of spaced slices are imaged from a first slice to a last slice of the scan series, the improvement including said hollow enclosure having a pair of end caps with means mounted on each of said caps for indicating the nominal centers of said first and last slices.

5. A phantom as in claim 4 where each of said means for indicating said nominal centers includes a pair of offset overlapping ramp wedges positioned together and on said respective end caps so the intersection of the respective ramps is located at said nominal center, whereby location error of said first and last slices is determined.

6. A phantom as in claim 1 where said MRI system provides a multi-slice scan series where a predetermined plurality of spaced slices are imaged, said means for measuring slice position including a plurality of groups of said plurality of channels in said plate-like structure arranged along said X-axis to correspond respectively to said spaced slices.

7. A phantom as in claim 6 where said plate-like structure includes a single diagonal groove means extending substantially from one end of said hollow enclosure to the other for indicating slice position in said scan series.

8. A phantom as in claim 1 or 2 where said hollow enclosure includes a pair of end caps at least one of said caps having an aperture for filling the enclosure with said fluid, together with sealing means for said aperture including bladder means for allowing the contraction and expansion of said sealed fluid, whereby the unconstrained travel of bubbles is prevented.

9. A phantom as in claim 8 where said bladder means includes closed cell foam.

10. A phantom as in claims 1 or 2 including an additional disk means for determining resolution of said MRI system, said disk means including a plurality of groups of apertures of successively smaller diameter.

11. A phantom as in claims 1 or 2 including an additional disk means for determining geometric distortion including a pattern of apertures in a rectangular array.

12. A phantom as in claim 1 where said channels are contiguous to one another when projected on an XZ plane.

13. A phantom as in claims 1 or 12 where said channels are spaced from one another when projected on a YZ plane.

14. A phantom as in claims 1 or 2 where closed cell foam is affixed to the interior of said enclosure to allow for contraction and expansion of said fluid.

15. A phantom as in claim 10 where for each of said groups of apertures, said apertures in a group have a common diameter equal to the separation of apertures in such group.

* * * * *